(12) United States Patent
Schwandner

(10) Patent No.: US 8,389,409 B2
(45) Date of Patent: Mar. 5, 2013

(54) METHOD FOR PRODUCING A SEMICONDUCTOR WAFER

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 478 days.

(21) Appl. No.: 12/778,198

(22) Filed: May 12, 2010

(65) Prior Publication Data

US 2010/0327414 A1    Dec. 30, 2010

(30) Foreign Application Priority Data

Jun. 24, 2009   (DE) .................. 10 2009 030 295

(51) Int. Cl.
*H01L 21/302* (2006.01)

(52) U.S. Cl. ........ 438/692; 438/689; 438/690; 438/691; 438/693

(58) Field of Classification Search .......... 438/689–693, 438/704
See application file for complete search history.

(56) References Cited

U.S. PATENT DOCUMENTS

| | | | |
|---|---|---|---|
| 5,733,177 A | 3/1998 | Tsuchiya et al. | |
| 6,413,156 B1 | 7/2002 | Shimizu et al. | |
| 6,443,807 B1 | 9/2002 | Sakai et al. | |
| 6,602,117 B1 | 8/2003 | Chopra et al. | |
| 6,878,630 B2 * | 4/2005 | Bang et al. ................ | 438/692 |
| 7,288,207 B2 | 10/2007 | Koyata et al. | |
| 2002/0055324 A1 | 5/2002 | Wenski et al. | |
| 2002/0069967 A1 | 6/2002 | Wright | |
| 2002/0077039 A1 | 6/2002 | Wenski et al. | |
| 2003/0109139 A1 | 6/2003 | Wenski et al. | |
| 2004/0043616 A1 | 3/2004 | Harrison et al. | |
| 2005/0142882 A1 * | 6/2005 | Kida et al. ................ | 438/692 |
| 2005/0227590 A1 | 10/2005 | Sung | |
| 2007/0158308 A1 * | 7/2007 | Koyata et al. ............. | 216/88 |
| 2008/0305722 A1 | 12/2008 | Roettger et al. | |
| 2009/0029552 A1 | 1/2009 | Schwandner et al. | |
| 2009/0130960 A1 | 5/2009 | Roettger et al. | |

FOREIGN PATENT DOCUMENTS

| | | |
|---|---|---|
| DE | 10333810 A1 | 3/2004 |
| DE | 202007035266 A1 | 1/2009 |
| DE | 10 2007 056 122 A1 | 5/2009 |
| EP | 1717001 A1 | 11/2006 |
| JP | 9-38849 A | 2/1997 |
| JP | 2000-315665 A | 11/2000 |
| JP | 2001-135605 A | 5/2001 |
| JP | 2002-231669 A | 8/2002 |
| JP | 2003-249466 A | 9/2003 |
| JP | 2004-96112 A | 3/2004 |

(Continued)

*Primary Examiner* — Jae Lee
(74) *Attorney, Agent, or Firm* — Brooks Kushman P.C.

(57) ABSTRACT

Semiconductor wafers are produced by a process of:
a) providing a semiconductor wafer by cutting a silicon ingot into wafers;
b) rounding the edge of the wafer, so that the wafer comprises plane surfaces on the frontside and backside and rounded oblique surfaces in the edge region;
c) polishing the frontside and backside of the wafer, the frontside being polished by chemical-mechanical polishing using a polishing pad which is free of abrasive fixed in the polishing pad; backside polishing being carried out in three steps, using a polishing pad containing fixed abrasive which is pressed onto the backside of the wafer, a polishing agent free of solids introduced between the polishing pad and the backside of the wafer in the first step, a polishing agent containing abrasive being introduced in the second and third steps, a polishing pressure of 8-15 psi in the first and second steps being reduced to 0.5-5 psi in the third step.

14 Claims, 2 Drawing Sheets

FOREIGN PATENT DOCUMENTS

| | | |
|---|---|---|
| JP | 2004-356336 A | 12/2004 |
| KR | 10-2003-0053084 A | 6/2003 |
| KR | 10-2006-0088032 A | 8/2006 |
| WO | 9213680 A1 | 8/1992 |
| WO | 9955491 A1 | 11/1999 |
| WO | 03074228 A1 | 9/2003 |

* cited by examiner

METHOD FOR PRODUCING A SEMICONDUCTOR WAFER

CROSS-REFERENCE TO RELATED APPLICATIONS

This application claims priority to German Patent Application No. DE 10 2009 030 295.6 filed Jun. 24, 2009 which is herein incorporated by reference.

BACKGROUND OF THE INVENTION

1. Field of the Invention

The invention relates to a method for producing a semiconductor wafer. In particular, the invention is intended for polishing semiconductor wafers of the next technology generations, primarily wafers which have a diameter of 300 mm or more, in particular a diameter of 450 mm.

2. Background Art

At present, polished or epitaxially coated semiconductor wafers with a diameter of 300 mm are used for the most demanding applications in the electronics industry. Silicon wafers with a substrate diameter of 450 mm are in development.

An essential reason why the electronics industry desires larger substrates for the production of their components, whether microprocessors or memory chips, resides in the enormous economic advantage which they promise. In the semiconductor industry it has for a long time been customary to focus on the available substrate area, or in other words to consider how great a number of components, i.e. logic chips or memory chips, can be accommodated on an individual substrate. This is related to the fact that a multiplicity of the component manufacturer's processing steps are aimed at the entire substrate, but there are also the individual steps for structuring the substrates, i.e. producing the component structures which subsequently lead to the individual chips, and therefore the production costs for both groups of processing steps are determined very particularly by the substrate size.

The substrate size thus influences the production costs per component to a very considerable extent, and is therefore of immense economic importance. However, increasing the substrate diameter entails great and sometimes entirely new, hitherto unknown technical problems. In particular, all the processing steps, whether they are purely mechanical (sawing, grinding, lapping), chemical (etching, cleaning) or chemical-mechanical in nature (polishing) as well as the thermal processes (epitaxy, annealing), require thorough revision, in particular with respect to the machines and systems (equipment) used for them.

The present invention focuses on the polishing of a semiconductor wafer as the last essential processing step when the wafer is intended for the production of highly integrated circuits such as memory chips, or in principle as the penultimate essential processing step which precedes epitaxy of the wafer, when the wafer is intended to be used as a so-called epi-wafer for the production of modern microprocessors.

The Inventor has discovered that the process of polishing 450 mm wafers requires a fundamental change. Those polishing methods known in the prior art which will be taken into consideration for defining the new polishing process will be presented below. This essentially involves modifications of the conventionally used methods of double sided polishing (DSP) and chemical-mechanical polishing (CMP), which in one case comprise polishing both sides of a semiconductor wafer by means of a polishing pad while supplying a polishing agent as a stock polishing (DSP step) and in the other case final polishing only of the frontside (the "component side") by using a softer polishing pad as so-called finish polishing (CMP step), but also relatively new so-called "fixed-abrasive polishing" (FAP) technologies in which the semiconductor wafer is polished on a polishing pad which, however, contains an abrasive substance bound in the polishing pad ("fixed-abrasive pad"). A polishing step in which such an FAP polishing pad is used will be referred to below as an FAP step for brevity.

Besides DSP, in the prior art so-called CMP polishing is also necessary in order to eliminate defects and reduce the surface roughness. In CMP, a softer polishing pad is used than in DSP. Furthermore only one side of the semiconductor wafer is polished by means of CMP, namely the side on which components are subsequently intended to be fabricated. The prior art also refers to this as finish polishing. CMP methods are disclosed, for example, in US 2002/0077039 and in US 2008/0305722.

WO 99/55491 A1 describes a two-stage polishing method with a first FAP polishing step and a subsequent second CMP polishing step. In CMP, the polishing pad contains no fixed abrasive substance. Here, as in a DSP step, an abrasive substance in the form of a suspension is introduced between the silicon wafer and the polishing pad. Such a two-stage polishing method is used in particular to eliminate scratches which the FAP step has left behind on the polished surface of the substrate.

EP 1 717 001 A1 is an example of FAP steps also being used for polishing semiconductor wafers, on the surface of which component structures have not yet been formed. Polishing such semiconductor wafers is primarily intended to generate at least one surface which is particularly flat and has the least possible microroughness and nanotopography.

US 2002/00609967 A1 relates to CMP methods for planarizing topographical surfaces during the production of electronic components. The main aim is to mitigate the disadvantages of low material removal rates when using FAP polishing pads. A sequence of polishing steps is proposed, in which polishing is carried out first with an FAP pad in conjunction with a polishing agent suspension and subsequently with an FAP pad in conjunction with a polishing agent solution. The series of steps is deliberately selected in order to increase the material removal rate. Polishing wafers of material with a homogeneous composition, for example semiconductor wafers, is not disclosed therein.

Likewise, WO 03/074228 A1 also discloses a method for planarizing topographical surfaces during the production of electronic components. Here, the key point of the invention is the endpoint recognition in CMP methods. As is known, endpoint recognition involves terminating the polishing and therefore the material removal promptly before material is removed from regions which are specifically not intended to be polished. To this end, a two-stage method is proposed for polishing a copper layer. In a first step it is polished with an FAP polishing pad, in which case the polishing agent optionally may or may not contain free abrasive particles. In the second polishing step in which it is likewise polished with an FAP pad, however, the use of a polishing agent with free abrasive particles is essential.

German Patent Application DE 102 007 035 266 A1 describes a method for polishing a substrate of silicon material, comprising two polishing steps of the FAP type which differ in that a polishing agent suspension which contains unbound abrasive substance as a solid is introduced between the substrate and the polishing pad in one polishing step, while in the second polishing step the polishing agent suspension is replaced by a polishing agent solution which is free of solids.

The expression "polishing agent" will be used below as an umbrella term for polishing agent suspensions and polishing agent solutions.

In connection with the fabrication of semiconductor wafers, particularly semiconductor wafers with a diameter of greater than or equal to 300 mm, semiconductor wafers with a diameter of 450 mm in particular, the handling properties, transport of the semiconductor wafers between the systems, the crucial storing, supporting and final processing properties in the process sequences are increasingly critical. This also applies to further processing of the semiconductor wafers on the part of the wafer manufacturers' customers in the processes for fabricating semiconductor components.

Here, in particular the backside of the semiconductor wafer is a crucial factor, especially since the various handling systems, in particular the devices which come in contact with the semiconductor wafer, necessitate particular backside properties of the semiconductor wafer. Such devices are for example chucks, i.e. wafer holders which hold the semiconductor wafer firmly on its backside, for example by means of vacuum suction, while the frontside is being processed, for example being ground. For systems in which the semiconductor wafer is held in its edge region, it is also important to configure the semiconductor wafer in the backside edge region so that deformation of the semiconductor wafer can be excluded. Particularly for semiconductor wafers of the next generation with a diameter of 450 mm, the properties of the wafer backside and the wafer edge will thus be crucial.

On the other hand, the backside of the semiconductor wafer is the supporting surface—for example during transport in boxes (FOUP, FOSB) or during storage or mounting in particular fabrication processes (for example coating chambers, oven processes etc.). Uncontrolled slipping of the semiconductor wafer needs to be avoided, whether during transport, loading or during the coating process.

Lastly, the requirements on the part of the customer should also be mentioned besides the process management by the wafer manufacturer: particularly critical in this regard are component production processes in which the properties of the backside of the wafers to be processed have a great influence on the success of the process step per se. This applies for example to all types of oven processes. The adhesion of the layers to be applied, for example oxide layers, depends very substantially on the surface properties, especially since the degree of reflectivity of a surface to be coated co-determines its emission and absorption behavior and therefore also the level of heat radiation absorbed and the process management per se, for example in the form of long or short coating times. The properties of the wafer backside have hitherto been ignored in this regard.

SUMMARY

It has now been surprisingly and unexpectedly discovered that the wafer backside properties critically affect the front side properties, and thus the problems described above have given rise to the object of the invention, namely to provide semiconductor wafers having defined and advantageous backside properties of the semiconductor wafer. In this respect, it is unimportant whether the wafer backsides are completely polished on one polishing machine and the wafer frontsides are accordingly polished on another polishing machine, or whether the same polishing machine is used.

These and other objects are achieved by a method for producing a semiconductor wafer, comprising:
a) providing a semiconductor wafer by cutting a silicon ingot into wafers,
b) rounding the edge of the semiconductor wafer, so that the semiconductor wafer comprises plane surfaces on the frontside and backside and rounded oblique surfaces in the edge region,
c) polishing the frontside and backside of the semiconductor wafer, the frontside polishing comprising chemical-mechanical polishing using a polishing pad which is free of abrasive fixed in the polishing pad; the backside polishing of the semiconductor wafer being carried out in three steps, in each case using a polishing pad which contains an abrasive substance bound in the polishing pad which is pressed with a polishing pressure onto the backside of the semiconductor wafer, a polishing agent which is free of solids being introduced between the polishing pad and the backside of the semiconductor wafer in the first step, while a polishing agent which contains abrasive substances is introduced in the second and third steps, a polishing pressure between 8-15 psi inclusively in the first and second steps being reduced to 0.5-5 psi in the third step.

DETAILED DESCRIPTION OF THE PREFERRED EMBODIMENTS

Figure 1:
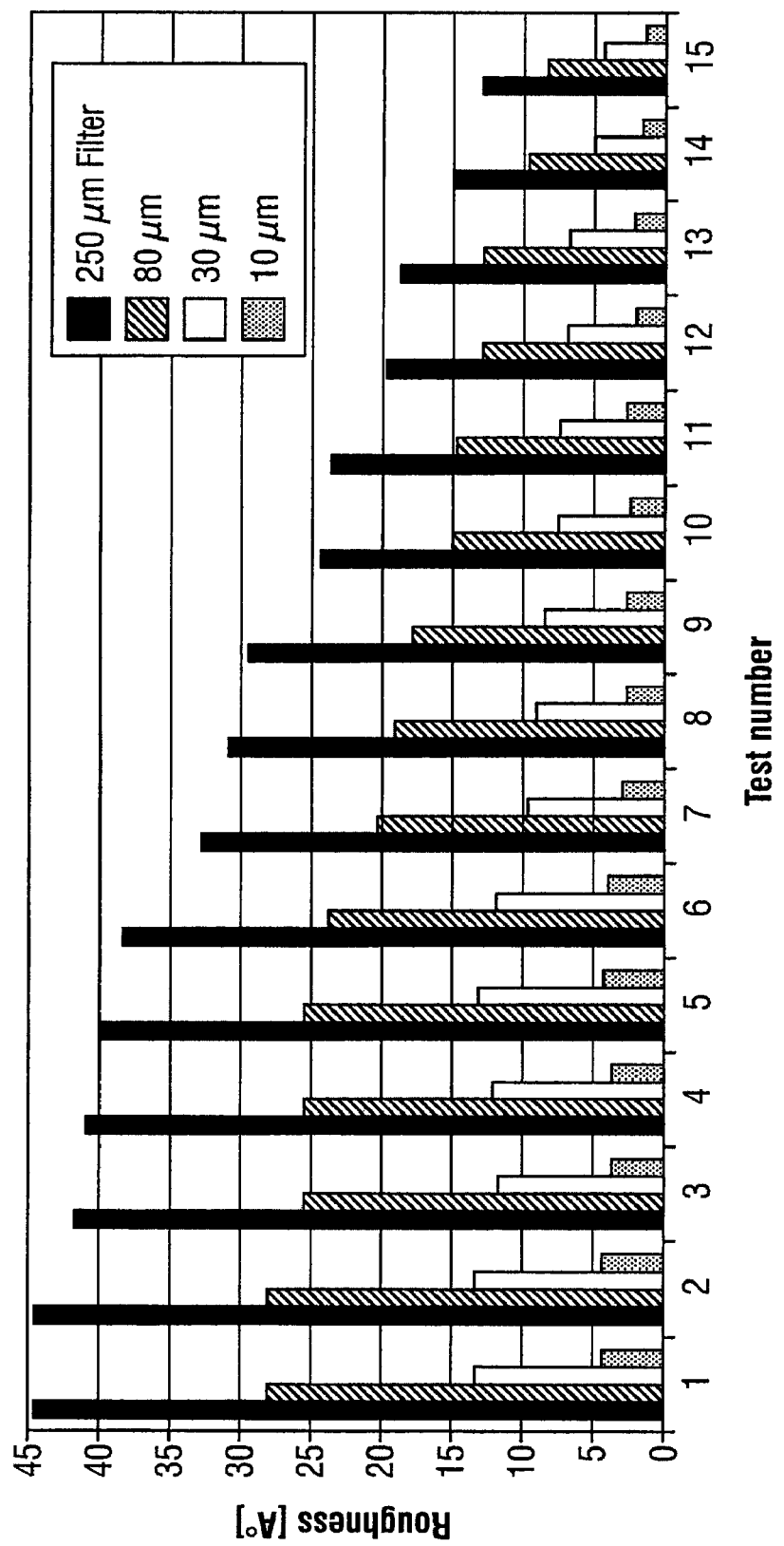
FIG. 1 shows roughness values of the backside of silicon semiconductor wafers with a diameter of 300 mm processed according to the invention.

According to the invention, a semiconductor wafer having a defined surface roughness on its backside is provided. Those skilled in the art know that conventional polishing methods such as stock polishing (double sided polishing, DSP) and finish polishing (chemical-mechanical polishing, CMP) both lead to semiconductor wafers with surface roughnesses on the frontside and backside in a relatively narrowly limited range.

When using a Chapman Surface Profiler MP 2000 for measuring the roughness of the surfaces with a 250 µm filter (spatial wavelengths longer than 250 µm=waviness data, cf. Chapman Technical Note-TG-1, Rev-01-09), an average surface roughness $R_a$ of from 3 to 6 angstroms is found both for the frontside and for the backside of DSP-polished semiconductor wafers.

The Inventor has realized that such low roughnesses for the wafer backside are not always advantageous, and that it would be desirable to make a wider range available for the backside roughness of the semiconductor wafer than is possible with conventional polishing technologies. It has been found that FAP polishing allows this. By means of FAP, it is possible to generate an average surface roughness $R_a$ according to Chapman (with a 250 µm filter) of from 3 to 45 angstroms. This covers a range 10 times larger than is possible by DSP/CMP. Corresponding roughness data when using 80 µm, 30 µm and 10 µm filters may be found in FIGS. 1 and 2.

For the invention, it is therefore essential to carry out backside polishing of the semiconductor wafer by means of FAP, in order to provide the desired defined backside roughness of the semiconductor wafer. Various types of polishing machines are suitable for this, for example a 3-plate single sided polishing machine of the "Reflection" type from Applied Materials Inc. or a 2-plate polishing machine of the "Apollo" type from Peter Wolters or a 1-plate polishing machine of the "nHance (6EG)" type from Strasbaugh.

The frontside polishing in step c) preferably leads to an average surface roughness $R_a$ of from 0.05 to 0.2 nm on the plane surfaces of the frontside of the semiconductor wafer.

On the plane surfaces of its backside, the semiconductor wafer preferably has an average surface roughness $R_a$ of from 0.3 to 4.5 nm, expressed in terms of a spatial wavelength less than or equal to 250 μm.

Preferably, the semiconductor wafer is epitaxially coated on its frontside in a further step d) at the end of step c). In the case of epitaxially coating silicon wafers, to this end, one or more silicon wafers are heated in the epitaxy reactor by means of heat sources, preferably by means of upper and lower heat sources, for example lamps or banks of lamps, and subsequently exposed to a gas mixture consisting of a source gas containing a silicon compound (silane(s)), a carrier gas (for example hydrogen) and optionally a doping gas (for example diborane).

The epitaxial layer is conventionally deposited by the CVD method ("chemical vapor deposition") by silanes, for example trichlorosilane ($SiHCl_3$, TCS), being supplied as a source gas to the surface of the silicon wafer, decomposed there at temperatures of from 600 to 1250° C. into elementary silicon and volatile byproducts, thus forming an epitaxially grown silicon layer on the silicon wafer.

After carrying out the method, the semiconductor wafer has an average surface roughness $R_a$ of from 0.05 to 0.2 nm on the plane surfaces of the frontside and an average surface roughness $R_a$ of from 0.3 to 4.5 nm on the plane surfaces of the backside, both expressed in terms of a spatial wavelength less than or equal to 250 μm.

Both the frontside and backside comprise rounded surfaces in the vicinity of the edge, which preferably have an average surface roughness $R_a$ of from 0.5 to 2 nm.

If the semiconductor wafer is provided with an epitaxial layer, the plane surfaces of the frontside have an average surface roughness $R_a$ of from 0.05 to 0.2 nm and the plane surfaces of the backside have an average surface roughness $R_a$ of from 0.3 to 4.5 nm, both expressed in terms of a spatial wavelength less than or equal to 250 μm.

The oblique and rounded surfaces of the frontside preferably have an average surface roughness $R_a$ of from 0.5 to 6 nm, and the oblique and rounded surfaces on the backside have an average surface roughness $R_a$ of from 0.5 to 2 nm.

In particular, the difference between the surface roughnesses of the plane surfaces of the backside $R_a(BS)$ and the oblique and rounded surfaces of the backside $R_a(BS\ edge)$ is preferably from −1.7 to 4 nm, more preferably from 0.8 to 1.8 nm, both for polished and for epitaxially coated semiconductor wafers.

The invention makes it possible to deliberately adjust the wafer backside roughness within a wide window, and therefore to ensure greater flexibility in relation to current and future customer requirements. The invention furthermore allows more selective process management by means of selected product properties of polished wafers.

The invention is intended in particular for processing and generating polished and epitaxially coated wafers with a diameter of 300 mm or more, more preferably with a diameter of 450 mm.

The Inventor has discovered that only sequential polishing of the frontside and backside of the semiconductor wafer is suitable for achieving the desired outcome. The batch polishing methods previously used, which polish a plurality of semiconductor wafers held on the carrier plates simultaneously and on both sides, are unsuitable for this and need to be replaced by single-wafer processing.

The polishing agent solution in the first step of backside polishing the silicon wafer in the method according to the invention is in the simplest case water, preferably deionized water (DIW), with the purity required for use in the silicon industry. The polishing agent solution may however also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$) and tetramethylammonium hydroxide (TMAH) or any mixtures thereof. It is particularly preferred to use potassium carbonate. The pH of the polishing agent solution preferably lies in a range of from 10 to 12 and the proportion of the compounds in the polishing agent solution is preferably from 0.01 to 10 wt. %, more preferably from 0.01 to 0.2 wt. %.

The polishing agent solution may furthermore contain one or more other additives, for example surface-active additives such as wetting agents and surfactants, stabilizers acting as protective colloids, preservatives, biocides, alcohols and sequestrants.

In the second step of backside polishing the semiconductor wafer, a polishing agent containing abrasive is used. The proportion of the abrasive substance in the polishing agent suspension is preferably from 0.25 to 20 wt. %, more preferably from 0.25 to 1 wt. %. The size distribution of the abrasive substance particles is preferably monomodal, and the average particle size is from 5 to 300 nm, more preferably from 5 to 50 nm.

The abrasive substance consists of a material which mechanically removes the substrate material, preferably one or more of the oxides of the elements aluminum, cerium or silicon. It is particularly preferable to use a polishing agent suspension which contains colloidally dispersed silica.

In the second step of polishing the backside, in contrast to the first step, additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) are preferably not introduced. The polishing agent suspension may however contain one or more other additives, for example surface-active additives such as wetting agents and surfactants, stabilizers acting as protective colloids, preservatives, biocides, alcohols and sequestrants.

In the third step of backside polishing the semiconductor wafer, a polishing agent containing abrasive is likewise used. The polishing pressure is reduced from 8-15 psi to 0.5-5 psi relative to the first and second steps. The proportion of the abrasive substance in the polishing agent suspension is preferably from 0.25 to 20 wt. %, more preferably from 0.25 to 1 wt. %, the size distribution of the abrasive particles is preferably monomodal, and the average particle size is from 5 to 300 nm, more preferably from 5 to 50 nm.

The abrasive substance consists of a material which mechanically removes the substrate material, preferably one or more of the oxides of the elements aluminum, cerium or silicon. It is particularly preferable to use a polishing agent suspension which contains colloidally dispersed silica.

In the third step of polishing the backside, in contrast to the first step, additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) are preferably not introduced. The polishing agent suspension may however contain one or more other additives, for example surface-active additives such as wetting agents and surfactants, stabilizers acting as protective colloids, preservatives, biocides, alcohols and sequestrants.

Basically, the semiconductor wafers are pressed with the aid of a "polishing head" with their side surface to be polished against the polishing pad lying on a polishing plate. A polishing head also comprises a "retainer ring", which encloses the substrate laterally and prevents it from sliding off the polishing head during the polishing.

In modern polishing heads, the semiconductor wafer's side surface facing away from the polishing pad bears on a resilient membrane which transmits the polishing pressure being exerted. The membrane is a component of a chamber system, which is formed by a gas or liquid cushion. Polishing heads are also used in which a resilient support ("backing pad") is employed instead of a membrane.

The polishing of the substrate is carried out while supplying a polishing agent between the substrate and the polishing pad and by rotating the polishing head and the polishing plate. In addition, the polishing head may also be moved in translation over the polishing pad so that more comprehensive use of the polishing pad surface is achieved. Furthermore, the method according to the invention may equally well be carried out on single-plate and multi-plate polishing machines, it being preferable to use multi-plate polishing machines with preferably two, more preferably three polishing plates and polishing heads. Different polishing pads and different polishing agents may also be used in this case.

In the method according to the invention, a polishing pad which contains an abrasive substance bound in the polishing pad (FAP or FA pad) is used for all three backside polishing steps. Suitable abrasive substances comprise for example particles of oxides of the elements cerium, aluminum, silicon or zirconium and particles of hard substances such as silicon carbide, boron nitride and diamond.

Particularly suitable polishing pads have a surface topography imparted by replicated microstructures. These microstructures ("posts") have, for example, the shape of columns with a cylindrical or polygonal cross section or the shape of pyramids or pyramid frustums. More detailed descriptions of such polishing pads are contained, for example, in WO 92/13680 A1 and US 2005/227590 A1. It is more preferred to use polishing pads containing cerium oxide particles, cf. also for example U.S. Pat. No. 6,602,117 B1 and the polishing pads described therein.

The grain sizes of the FAP polishing pads used are preferably greater than or equal to 0.1 μm and less than or equal to 1.0 μm. If a high backside roughness near the top of the claimed range is desired, then FAP pads with grain sizes of 0.5-1.0 μm will preferably be used. If a low backside roughness is desired, FAP pads with grain sizes of 0.1-0.25 μm will preferably be used. Using FAP pads with grain sizes much smaller than 0.1 μm or much larger than 1.0 μm does not lead to the desired outcome.

Edge polishing of the semiconductor wafer is preferably carried out on a centrally rotating chuck, bringing together the semiconductor wafer and a centrally rotating polishing drum which is inclined relative to the chuck and carries a polishing pad containing fixed abrasive, and pressing together the semiconductor wafer and the polishing drum while continuously supplying a polishing agent, which contains no solids. After carrying out step b), the semiconductor wafer has a rounded edge (produced by means of conventional edge grinding methods).

This semiconductor wafer edge is polished either before or after step c) by means of a polishing drum, on the surface of which a hard polishing pad with little compressibility and containing fixed abrasive is adhesively bonded, while supplying an alkaline solution. Preferably, a smoothing step is then carried out in a second step on the same polishing pad while supplying a silica sol, for example Glanzox 3900 with about 1 wt. % $SiO_2$. For this edge polishing, the same polishing agent solutions and suspensions are preferred as in the frontside and backside polishing according to step c) of the method. The same also applies to the polishing pad being used.

In particular, in the edge polishing it is also preferable to use a polishing pad containing abrasive in the form of particles with a size of from 0.1 μm to 1.0 μm. The particles are preferably selected from the group consisting of oxides of the elements cerium, aluminum, silicon and zirconium.

EXAMPLES

The tests were carried out on a polishing machine of the "nHance 6EG" type from Strasbaugh Inc. The polishing machine from Strasbaugh Inc. has a polishing plate with a polishing pad and a polishing head, which processes a semiconductor wafer fully automatically. The polishing head is universally mounted and comprises a fixed baseplate which is covered with a "backing pad", and a mobile retainer ring. Air cushions, on which the semiconductor wafer floats during the polishing, can be set up through holes in the base plate in two concentric pressure zones: an inner pressure zone and an outer pressure zone. The mobile retainer ring can be pressurized by means of a compressed air bladder so as to prestress the polishing pad upon contact with the semiconductor wafer, and keep it flat.

In all the tests, polishing step 1 was a stock polishing step with $K_2CO_3$ solution (0.2 wt. %). The second polishing step was carried out using Glanzox 3900* (1 wt. %) without $K_2CO_3$ and in general with the same polishing pressure as step 1. Glanzox 3900* is the product name of the polishing agent suspension which is provided as a concentrate by Fujimi Incorporated, Japan. The undiluted solution has a pH of 10.5 and contains about 9 wt. % of colloidal $SiO_2$ with an average particle size of from 30 to 40 nm. The third polishing step was carried out while supplying Glanzox 3900 (1 wt. %) and without $K_2CO_3$, and with a lower polishing pressure than in substeps 1 and 2. Optionally, step 3 is followed by a low-pressure polishing step while supplying surfactants or surfactants+DIW (deionized water). Tests were carried out with FAP pads which had different grain sizes of from 0.1 to 1 μm.

For the tests shown in the figures, a polishing pad with fixed cerium oxide abrasive was used, as described for example in U.S. Pat. No. 6,602,117 B1. The average particle size was 0.5 μm.

For the chemical-mechanical polishing of the frontside, a typical stock polishing pad was used. Suitable for this are, for example, a polishing pad of the series SUBA™ from Rohm & Haas, for example the SUBA™ 1250 ("stock pad") or a typical CMP polishing pad ("finishing pad") such as the SPM 3100 from Rodel®.

FIG. 1 shows roughness values of the backside of silicon semiconductor wafers with a diameter of 300 mm processed according to the invention. 15 tests were carried out under different polishing conditions. Roughness values of from 1.3 to 4.5 nm were found (250 μm filter).

Tests 1 to 9 comprise a stock polishing step with $K_2CO_3$ solution (0.2 wt. %), followed by a second polishing step using a polishing agent solution (Glanzox 3900) without supplying $K_2CO_3$ and a third polishing step with Glanzox 3900 without supplying $K_2CO_3$, and with a lower polishing pressure than in the first two polishing steps. Thus, the polishing pressure in each of the first two steps is between 7-13 psi, while in the third polishing step it is 0.5-2 psi. Tests 10 to 13 additionally contain a polishing step with DIW being supplied.

Figure 2:
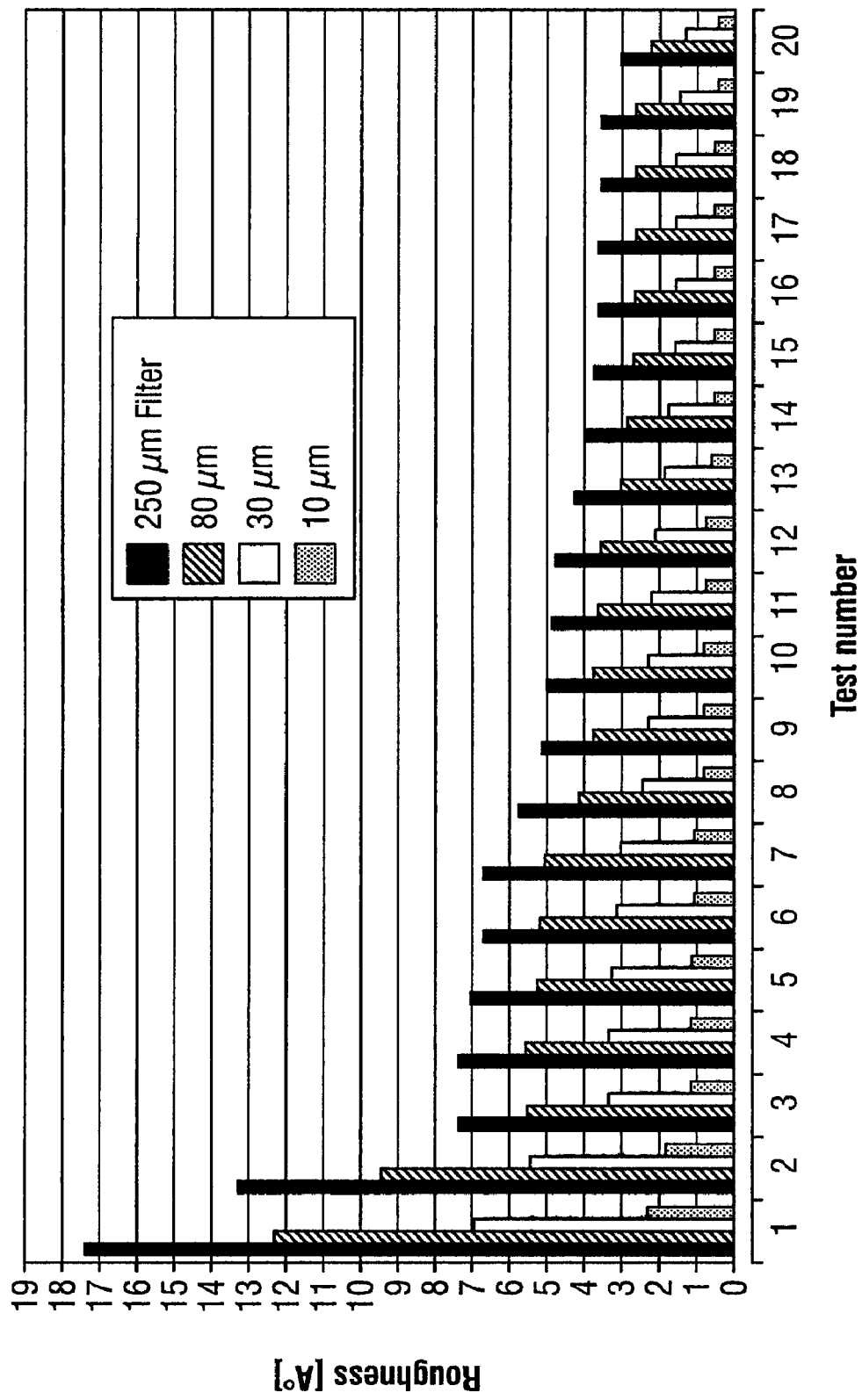
FIG. 2 shows roughness values for the backside of semiconductor wafers processed according to the invention.

FIG. 2 likewise shows roughness values for the backside of semiconductor wafers processed according to the invention. Roughness values of from 0.3 to about 1.7 nm were found (250 μm filter).

Here again, all the tests comprise stock polishing with a polishing pressure of 10-13 psi while supplying $K_2CO_3$ solution, a second polishing step while supplying Glanzox 3900 with a polishing pressure of 10-13 psi and a third polishing step at a polishing pressure of 0.5-3.5 psi. In Tests 14 to 20, the polishing agent flow rate in the first two steps was 3000-5000 ml/min, while in the third step it was 350 ml/min. In Test 1, however, the polishing agent flow rate in the second polishing step was 100 ml/min.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a semiconductor wafer, comprising:
   a) providing a semiconductor wafer by cutting a silicon ingot into wafers;
   b) rounding the edge of the semiconductor wafer, so that the semiconductor wafer comprises plane surfaces on the frontside and backside and rounded oblique surfaces in the edge region;
   c) polishing the frontside and backside of the semiconductor wafer, the frontside polishing comprising chemical-mechanical polishing using a polishing pad which is free of abrasive fixed in the polishing pad; the backside polishing of the semiconductor wafer being carried out in three steps, in each case using a polishing pad which contains fixed abrasive in the polishing pad which is pressed with a polishing pressure onto the backside of the semiconductor wafer, a polishing agent which is free of solids being introduced between the polishing pad and the backside of the semiconductor wafer in the first step, while a polishing agent which contains abrasive substances is introduced in the second and third steps, a polishing pressure of 8-15 psi in the first and second steps being reduced to 0.5-5 psi in the third step.

2. The method of claim 1, furthermore comprising:
   d) epitaxially coating the frontside of the semiconductor wafer.

3. The method of claim 1, wherein the polishing agent solution in the first step of backside polishing the semiconductor wafer contains deionized water (DIW).

4. The method of claim 3, wherein the polishing agent solution further comprises at least one compound selected from the group consisting of sodium carbonate ($Na_2CO_3$), potassium carbonate ($K_2CO_3$), sodium hydroxide (NaOH), potassium hydroxide (KOH), ammonium hydroxide ($NH_4OH$) and tetramethylammonium hydroxide (TMAH).

5. The method of claim 4, wherein the pH of the polishing agent solution is from 10 to 12 and the proportion of the compound(s) in the polishing agent solution is from 0.01 to 10 wt. %.

6. The method of claim 1, wherein the polishing agent suspension in the second polishing step contains particles of one or more of the oxides of the elements aluminum, cerium or silicon.

7. The method of claim 2, wherein the polishing agent suspension in the second polishing step contains particles of one or more of the oxides of the elements aluminum, cerium or silicon.

8. The method of claim 6, wherein the polishing agent suspension comprises colloidally dispersed silica.

9. The method of claim 1, wherein the polishing pad containing fixed abrasive contains abrasive in the form of particles of oxides of the elements cerium, aluminum, silicon and zirconium, particles of hard substances silicon carbide, boron nitride and diamond, or mixtures thereof.

10. The method of claim 9, wherein the mean particle size of the fixed abrasive in the polishing pad is greater than or equal to 0.1 μm and less than or equal to 1.0 μm.

11. A semiconductor wafer produced by the method of claim 1, having a polished frontside, a polished backside and a rounded and polished edge, which comprises plane surfaces on the frontside and backside and oblique rounded surfaces in the edge region, and which has an average surface roughness $R_a$ of from 0.05 to 0.2 nm on the plane surfaces of its frontside and an average surface roughness $R_a$ of from 0.3 to 4.5 nm on the plane surfaces of its backside, both expressed in terms of a spatial wavelength less than or equal to 250 μm.

12. The semiconductor wafer of claim 11, wherein the rounded surfaces on the frontside and backside have an average surface roughness $R_a$ of from 0.5 to 2 nm.

13. A semiconductor wafer produced by the method of claim 2, having a polished and epitaxially coated frontside, a polished backside and a rounded and polished edge, which comprises plane surfaces on the frontside and backside and oblique rounded surfaces in the edge region, and which has an average surface roughness $R_a$ of from 0.05 to 0.2 nm on the plane surfaces of its epitaxially coated frontside and an average surface roughness $R_a$ of from 0.3 to 4.5 nm on the plane surfaces of its backside, both expressed in terms of a spatial wavelength less than or equal to 250 μm.

14. The semiconductor wafer of claim 13, which has an average surface roughness $R_a$ of from 0.5 to 6 nm on the oblique and rounded surfaces of the frontside, and an average surface roughness $R_a$ of from 0.5 to 2 nm on the oblique and rounded surfaces of the backside.

* * * * *